(12) United States Patent
Schulz et al.

(10) Patent No.: US 9,077,338 B1
(45) Date of Patent: Jul. 7, 2015

(54) METHOD AND CIRCUIT FOR SCALABLE CROSS POINT SWITCHING USING 3-D DIE STACKING

(71) Applicant: Altera Corporation, San Jose, CA (US)

(72) Inventors: Jeffrey Schulz, San Jose, CA (US); Michael Hutton, San Jose, CA (US)

(73) Assignee: ALTERA CORPORATION, San Jose, CA (US)

( * ) Notice: Subject to any disclaimer, the term of this patent is extended or adjusted under 35 U.S.C. 154(b) by 0 days.

(21) Appl. No.: 14/282,510

(22) Filed: May 20, 2014

(51) Int. Cl.
| | |
|---|---|
| G06F 13/00 | (2006.01) |
| H01L 25/00 | (2006.01) |
| H03K 19/173 | (2006.01) |
| G06F 13/40 | (2006.01) |
| H03K 19/177 | (2006.01) |
| G06F 15/173 | (2006.01) |

(52) U.S. Cl.
CPC ........ H03K 19/1735 (2013.01); H03K 19/1737 (2013.01); G06F 13/4022 (2013.01); G06F 15/17375 (2013.01)

(58) Field of Classification Search
CPC ................. H03K 19/17739; H03K 19/17728; H03K 19/17704; G06F 13/4022; G06F 15/17375; H04L 49/101
USPC ....................... 326/37–41, 47, 101
See application file for complete search history.

(56) References Cited

U.S. PATENT DOCUMENTS

| | | | |
|---|---|---|---|
| 6,404,225 B1 * | 6/2002 | Rangasayee | 326/39 |
| 6,721,311 B1 * | 4/2004 | Samsudin et al. | 370/369 |
| 7,057,412 B1 * | 6/2006 | Burney | 326/38 |
| 7,177,301 B2 * | 2/2007 | Ruehle | 370/352 |
| 7,256,611 B2 * | 8/2007 | Holberg et al. | 326/41 |
| 8,519,740 B2 * | 8/2013 | Hutton et al. | 326/38 |
| 8,542,032 B1 * | 9/2013 | Hutton et al. | 326/38 |
| 2013/0227249 A1 * | 8/2013 | Barowski et al. | 712/22 |

* cited by examiner

*Primary Examiner* — Dylan White
(74) *Attorney, Agent, or Firm* — Nixon Peabody LLP

(57) ABSTRACT

A cross-point switch having stacked switching dies on a component die is disclosed. The cross point switch allows scalability by adding switching dies. The switching dies include ingress switches that are coupled to multiplexers to a middle stage switches. The inputs and outputs of the ingress switches are connected to the switching interface region via through silicon vias (TSVs). The outputs of the ingress switches are also coupled by TSVs to multiplexers for routing to middle stage switches on a switching die above. If the switching die is stacked on another switching die, the outputs of the ingress switches are coupled by TSVs to the multiplexers for routing to the middle stage switches of the switching die below. By adding switching dies, the switch is configurable to increase the number of ports as well as the width of the ports.

20 Claims, 5 Drawing Sheets

METHOD AND CIRCUIT FOR SCALABLE CROSS POINT SWITCHING USING 3-D DIE STACKING

TECHNICAL FIELD

The present disclosure relates generally to crossbar switches and more specifically to a scalable three dimensional cross-point switch.

BACKGROUND

Switching in integrated circuits is necessary in order to properly route data to and from different logic and arithmetic components on the integrated circuit. As the complexity of integrated computing circuits has increased, the need for more flexible switches allowing routing of data between a variety of components has increased. For example, high capacity switches are useful in programmable hardware such as field-programmable gate array (FPGA) technology where logic components may have interconnections that are changed based on a configured subset of logic components needed to perform a function.

Traditional switches have a history dating back to the physical N×N telephone switches of the last century, through multi-stage networks developed in the 1950s and leading to modern telecommunications routers. An N×N switch is capable of passing data between any one of a first plurality of N-directional input ports to any one of N-directional output ports. Portions of a router may be implemented all or in-part in FPGA and application specific integrated circuit (ASIC) logic.

A Clos network is a well-known method for building N×N cross point switches recursively (meaning that an n-input network is built from other m-input networks where m<n). A general 3-stage Clos network consists of an ingress, middle, and egress network of crossbar switches, with parameters r, n, and m to implement an N×N permutation network with N=r*n. Each ingress stage crossbar switch has m outlets, and there are m middle stage crossbar switches. There is exactly one connection between each ingress stage switch and each middle stage switch. There are r egress stage switches, each with m inputs and n outputs. Each middle stage switch is connected exactly once to each egress stage switch. Thus, the ingress stage has r switches, each of which has n inputs and m outputs. The middle stage has m switches, each of which has r inputs and r outputs. The egress stage has r switches, each of which has m inputs and n outputs.

Such networks may have different categories such as blocking, non-blocking, rearrangeable, etc. A network is non-blocking if m≥2n−1, meaning that a new connection may be made without tearing up any existing connection. If m>n, then the network is rearrangeable, but not non-blocking as a new solution may be found, but not without changing some existing connection or connections.

As explained above, cross point switches are prominent in data communications applications, both in packet based switching and in optical transport. However, in the case of programmable hardware, different applications often require different cross point structures as the different applications require variable numbers of logical components to be connected. In order to maintain the flexibility of programmable hardware, making any design decision to harden a cross point switch on an FGPA die is a difficult proposition to justify from a cost and usage perspective since such a hardened switch has to have the maximum connection capability in order to be used for the universe of applications the FPGA die may be configured for.

FPGA users may have applications that require a cross point switch to connect different components on the FPGA die to implement the applications. However, the switch composition between different user applications may be different, making a general hardened logic solution very difficult to adapt to the various user needs. For example, one user may require 64 ports with each port being 100 bits wide. In contrast, a second user may require 16 ports each being 400 bits wide. The two users both require a cross point switch with the same number of inputs and outputs. A hardened solution that satisfies both user requirements is very difficult to build. Such a conventional hard logic solution would require building a cross point switch at the maximum parameters wanted by either user e.g., 64 ports at 400 bits wide for each port. Such a design satisfies the needs of both users, but increases the cost and complexity of the device.

SUMMARY

One disclosed example is a cross point switch that includes a series of hard logic switching dies that are stacked on a component die having a switching interface region. Each of the hardware switching dies includes ingress switches that are coupled to multiplexers to middle stage switches. The inputs and outputs of the ingress switches on the stacked switching dies are connected to the switching interface region via through-silicon vias (TSVs). The outputs of the ingress switches are also coupled by TSVs to multiplexers for routing to middle stage switches on a second switching die stacked above an initial switching die. The outputs of the ingress switches of the second switching die are coupled by TSVs to the multiplexers for routing to the middle stage switches of the switching die below. By stacking additional switching dies, the switch is configurable to increase the number of ports as well as the width of the ports.

Additional aspects will be apparent to those of ordinary skill in the art in view of the detailed description of various embodiments, which is made with reference to the drawings, a brief description of which is provided below.

BRIEF DESCRIPTION OF THE DRAWINGS

The foregoing and other advantages will become apparent upon reading the following detailed description and upon reference to the drawings.

Figure 1A:
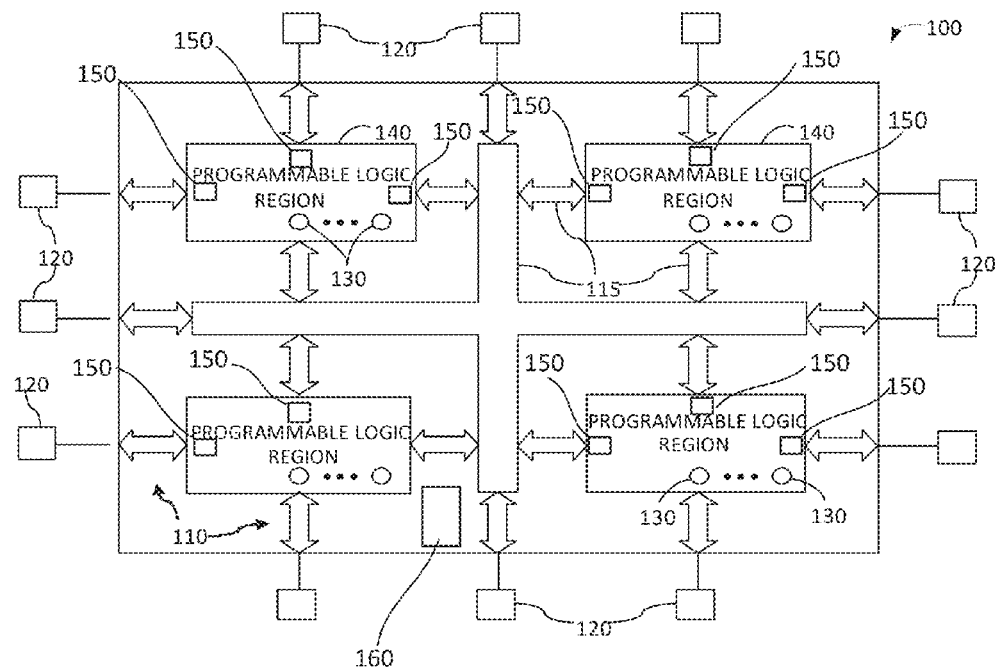
FIG. 1A is a diagram of a component circuit die with stacked three-dimensional cross point switching units.

While the invention is susceptible to various modifications and alternative forms, specific examples have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

An illustrative example of an integrated circuit component die is a programmable logic device (PLD) 100 in accordance with an embodiment is shown in FIG. 1A. The programmable logic device 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 includes conventional input/output circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry such as configurable register circuitry. As an example, the configurable register circuitry may operate as a conventional register. Alternatively, the configurable register circuitry may operate as a register with error detection and error correction capabilities.

The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

Programmable logic device 100 contains programmable memory elements 130. Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM (CRAM), or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) or logic clusters of regions of logic containing for example multiple logic elements or multiple ALMs.

During device programming, configuration data is loaded into device 100 that configures the programmable logic regions 140 so that their logic resources perform desired logic functions. For example, the configuration data may configure a portion of the configurable register circuitry to operate as a conventional register. If desired, the configuration data may configure some of the configurable register circuitry to operate as a register with error detection and error correction capabilities.

The programmable logic device (PLD) 100 is fabricated on a component die and in this example includes three dimensional, configurable, cross point switching units 150 that each include stacks of hard wired switching dies. The switching units 150 allow flexible and scalable cross connections between various components in the programmable logic regions 140 on the programmable logic device 100. The switching units 150 also allow communication between selected inputs and outputs for the programmable logic regions 140 to the programmable interconnects 115 or the input/output circuitry 110 to and from components on the component die or devices external to the die. In this example, the circuit device is the programmable logic device 100 but the principles described herein may be incorporated in any type of appropriate circuit. An optional processor 160 is included to facilitate switching between the logic components in the programmable logic regions 140 by configuring the switching units 150 in accordance to a switching program or programs as will be explained below. Although in this example, one processor is shown, the configuration functions may be performed by multiple processors each in proximity to respective switching units 150 on the programmable logic device 100.

Figure 1B:
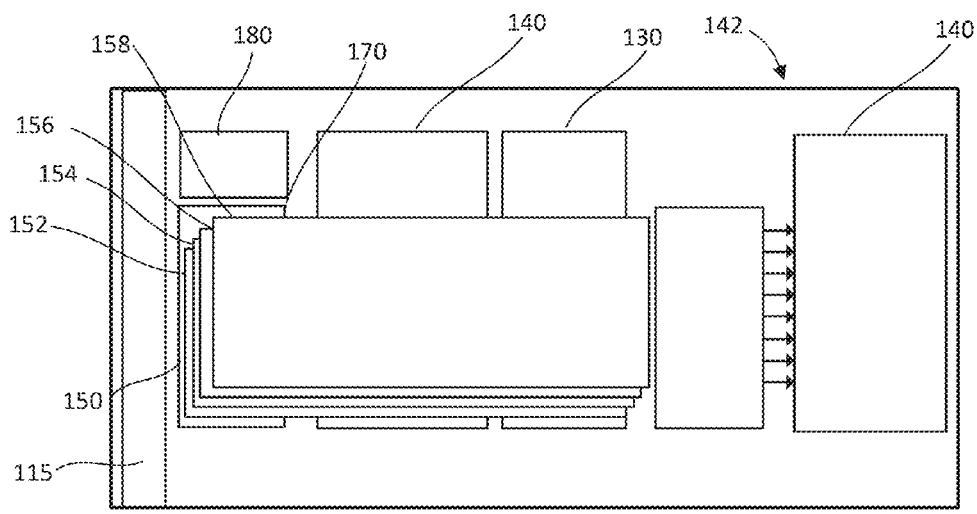
FIG. 1B is a close up view of one of the component areas of the circuit die in FIG. 1A with a set of stacked switching dies in a three-dimensional cross point switching unit.

FIG. 1B is a close up view of a programmable component area 142, which includes two of the programmable logic regions 140 of the programmable logic device 100 in FIG. 1A. The programmable component area 142 is formed as part of the component die of the programmable logic device 100. The programmable component area 142 includes a switching unit 150, which includes a series of stacked switching dies 152, 154, 156, and 158. In this example the programmable component area 142 includes different logic components in the programmable logic region 140. The inputs and outputs from the components in the programmable logic regions and the memory components in the memory region 130 are routed via the switching unit 150 to the programmable interconnects 115 or the input/output circuitry 110. The switching dies 152, 154, 156, and 158 extend over the programmable logic region 140 and memory region 130, which allows connections to another programmable logic region 140.

The switching unit 150 also includes a switching interface region 170 in the programmable component area 142. The switching interface region 170 includes a number of through-silicon vias (TSVs) that connect input ports and output ports leading to the programmable logic region 140 with each of the stacked switching dies 152, 154, 156, and 158. As will be explained below, changing the connections between the switches on the switching dies 152, 154, 156, and 158 allows the scaling of a switching unit for selection of different numbers of inputs and outputs to and from the components of the programmable component area 142. The cross point switching unit 150 in this example allows inputs to be directed to the components of the programmable component area 142. Another switching unit (not shown) allows outputs of the components to be directed to connections such as the programmable interconnects 115 and input/output circuitry 110. As will be explained below, the cross point switching unit 150 may be configurable as to the number of switching input ports as well as the width of the switching input ports via control signals from a switching control circuit 180.

Figure 2A:
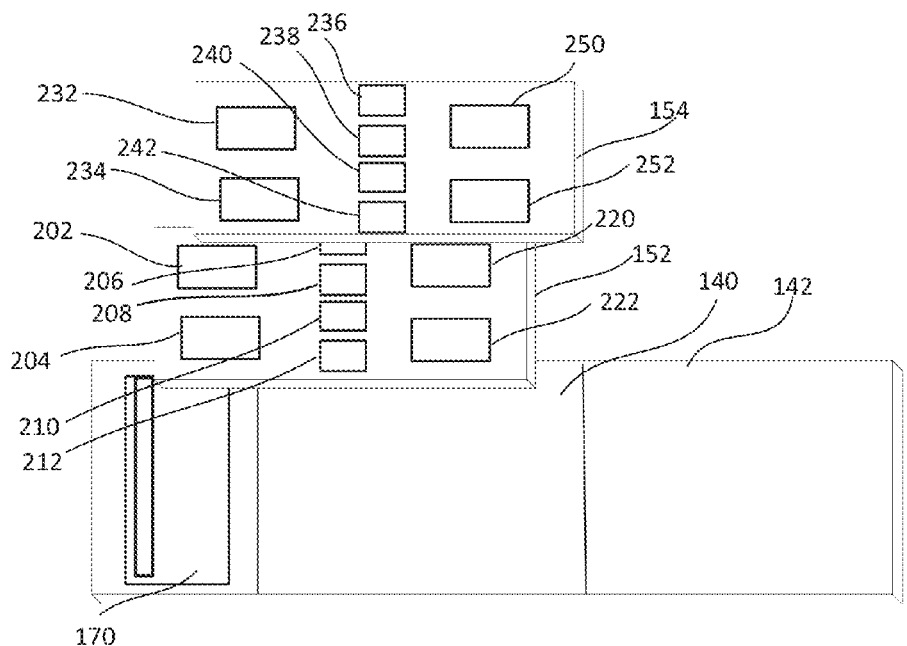
FIG. 2A is an exploded close-up view of the component area of the circuit die and switching dies in FIG. 1B.

FIG. 2A shows a detailed exploded view of the switching dies 152 and 154, which are stacked on the programmable component area 142 of the component die shown in FIG. 1B. As shown in FIG. 2A, the switching dies 152 and 154 are stacked on top of each other and, in conjunction with the switching interface region 170, provide three-dimensional switching for the programmable logic region 140 of the programmable component area 142. The first switching die 152 in this example includes ingress stage switches 202 and 204. The outputs of the switch 202 are coupled to one of the inputs of the multiplexers 206 and 208 respectively. The outputs of the multiplexers 206 and 208 are each coupled to one of the inputs of a middle stage switch 220. Similarly, the outputs of the switch 204 are coupled to one of the inputs of the multiplexers 210 and 212 respectively. The outputs of the multiplexers 210 and 212 are each coupled to one of the inputs of a middle stage switch 222. Although the multiplexers 206, 208, 210, and 212 are hardwired on the switching die 252 with the ingress stage switches 202 and 204 in this example, the multiplexers could be located on other dies such as the component die 100.

Similarly, the second switching die 154 in this example includes ingress stage switches 232 and 234. The outputs of the switch 232 are coupled to one of the inputs of the multiplexers 236 and 238 respectively. The outputs of the multiplexers 236 and 238 are each coupled to one of the inputs of a middle stage switch 250. Similarly, the outputs of the switch 234 are coupled to one of the inputs of the multiplexers 240 and 242 respectively. The outputs of the multiplexers 240 and 242 are each coupled to one of the inputs of a middle stage switch 252.

As will be explained below, the switching die 154 includes three-dimensional connecting through-silicon vias (TSVs) that connect the switches 232 and 234 to the switches 220 and 222 and multiplexers 206, 208, 210, and 212 of the switching die 152 below the switching die 154 and connecting TSVs to corresponding switches and multiplexers of the switching die 156 above the switching die 154. The switching die 154 also includes TSVs that connect the switches 232, 234, 250, and 252 to inputs and outputs on the switching interface region 170.

Figure 2B:
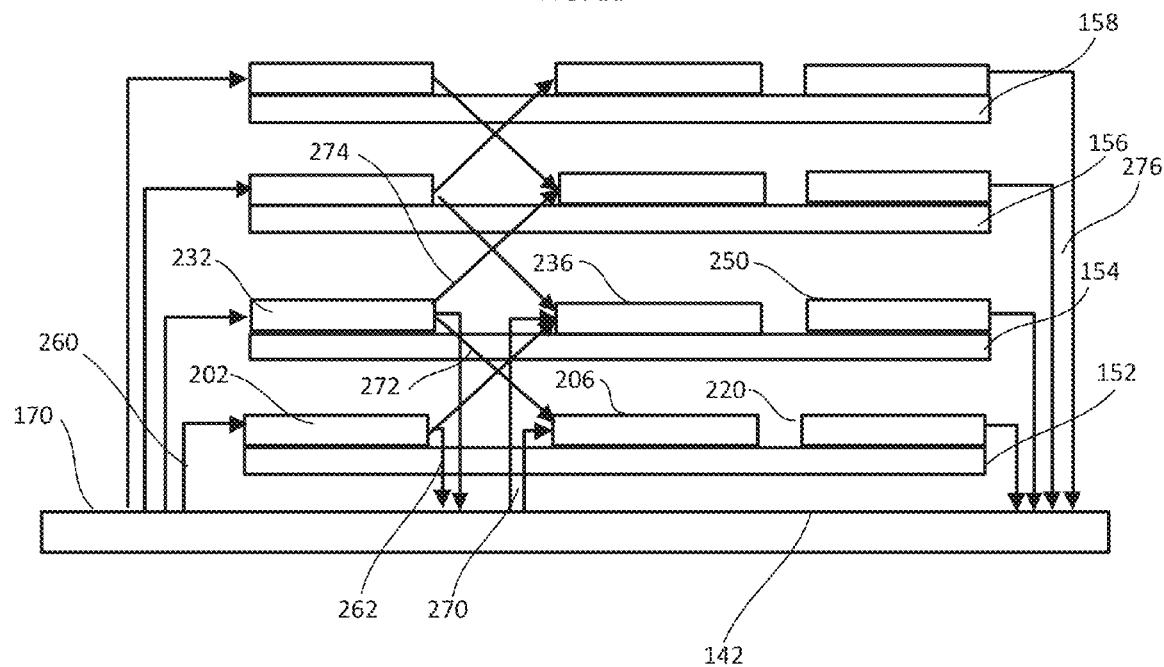
FIG. 2B is a side view of the stacked switching dies and the component area of the circuit die in FIG. 1B.

FIG. 2B is an exploded side view of the switching dies 152, 154, 156, and 158 stacked on the switching interface region 170 of the component area 142 in FIG. 1B. The switching interface region 170 includes a series of input through-silicon vias (TSV) 260, which access the inputs to the first set of ingress switches on the switching dies 152, 154, 156, and 158 such as the ingress switches 202 and 222. A series of output TSVs 262 couples the outputs from the first set of ingress switches on the switching dies 152, 154, 156, and 158 to output ports of the switching interface region 170.

Another set of TSVs 270 allows the switching interface region 170 to access inputs to the multiplexers, such as the multiplexers 206 and 208, on the switching dies and therefore the middle stage of switches on a switching die such as the switches 220 and 250. There are additional cross-connector TSVs 272 such as a cross-connector that connects the output of switches on the switching die 154 to a multiplexer on the switching die 152 below the switching die 154. Another set of cross-connector TSVs 274 couples the outputs of the ingress switches on the switching die 154 to a multiplexer on the switching die 156 above the switching die 154. A set of output TSVs 276 couple the outputs of the middle stage switches on the switching dies 152, 154, 156, and 158 to output ports of the switching interface region 170.

Figure 3:
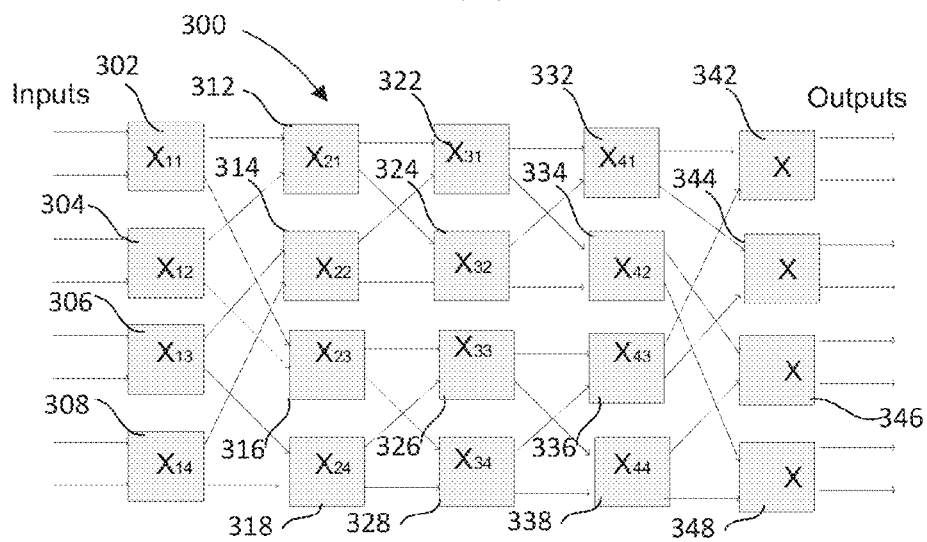
FIG. 3 is a configuration of the switching topography of an example cross point switch formed from cross bar switches.

FIG. 3 shows an example 8×8 switching unit 300 that may be one configuration of the switching interface region 170 in conjunction with the switching dies 152, 154, 156, and 158 in FIGS. 1B, 2A, and 2B. Thus, the switching unit 300 is an 8×8 Benes network built from 2×2 crossbar switches. FIG. 3 shows a series of ingress stage switches 302, 304, 306, and 308. The outputs of the initial stage switches 302, 304, 306, and 308 are cross coupled with a series of middle stage switches 312, 314, 316, and 318. The outputs of the middle stage switches 312, 314, 316 are further cross connected with the inputs of further middle stage switches 322, 324, 326, and 328. The outputs of the further middle stage switches 322, 324, 326, and 328 are coupled to the inputs of another set of middle stage switches 332, 334, 336, and 338. The outputs of the middle stage switches 332, 334, 336, and 338 are coupled to the inputs of a set of egress stage switches 342, 344, 346, and 348. The pattern of the connections between the outputs of the middle stage switches 332, 334, 336, and 338 and the inputs of the set of egress stage switches 342, 344, 346, and 348 are in a pattern similar to the connections of the outputs of the ingress stage switches 302, 304, 306, and 308 to the inputs of the middle stage switches 312, 314, 316, and 318.

Each of the switches in FIG. 3 have two inputs and two outputs and are cross connected to each other in order to form the 8×8 cross bar switch. For example, the two outputs of the switch 302 (X11) are coupled to the inputs of the switch 312 (X21) and the switch 316 (X23) respectively. The two outputs of the switch 304 (X12) are coupled to the inputs of the switch 312 (X21) and the switch 316 (X23) respectively. The two outputs of the switch 306 (X13) are coupled to the inputs of the switch 314 (X22) and the switch 318 (X24) respectively. The two outputs of the switch 308 (X14) are coupled to the inputs of the switch 314 (X22) and the switch 318 (X24) respectively. As will be explained below, the ingress stage switches 302, 304, 306, and 308 and the middle stage switches 312, 314, 316, and 318 may correspond to switches on the switching dies 152 and 154, which are 2×2 cross bars (e.g., switches 232, 234, 250, and 252 of switching die 154).

The pattern for the outputs of the middle stage switches 310, 312, 316, and 318 are also shown in FIG. 3. For example, the two outputs of the switch 312 (X21) are coupled to the inputs of the switch 322 (X31) and the switch 324 (X32) respectively. The two outputs of the switch 314 (X22) are coupled to the inputs of the switch 322 (X31) and the switch 324 (X32) respectively. The two outputs of the switch 316 (X23) are coupled to the inputs of the switch 326 (X33) and the switch 328 (X34) respectively. The two outputs of the switch 318 (X24) are coupled to the inputs of the switch 326 (X33) and the switch 328 (X34) respectively.

As explained above, relaxing the number of stages in the switch allows for a recursively implementable network of smaller blocks. In the example in FIG. 3, for N=r*n, where r is the 4 egress switches having 2 outputs (n) and an N×N switch, a Benes network is built from 2×2 crossbars, such as the example 8×8 Benes network in FIG. 3. Although the example Benes network in FIG. 3 is an efficient network for implementing simple crossbars, a key problem is that expanding the network in FIG. 3 introduces a new shuffle function, which requires a different interconnect pattern. This means that for a fixed switch in a single level integrated circuit die, the switch may be built with the right interconnect, but expanding the switch to allow for a programmable platform makes the switch interconnect difficult to harden in a general fashion. In the programmable interconnect scenario, there are also a large number of long routes, slowing cross point switch performance. The prior art implementation in two dimensions of the 8×8 switching unit in FIG. 3 (e.g., on a single chip layer) suffers as it is expanded because of the resulting large number of long routes that slow cross point switching performance. As will be explained below, the 8×8 switch network in FIG. 3 may be expanded when implemented in three dimensions using the stacked switching dies in FIGS. 2A and 2B. The implementation eliminates the long routes and provides scalability without additional connection patterns.

Figure 4:
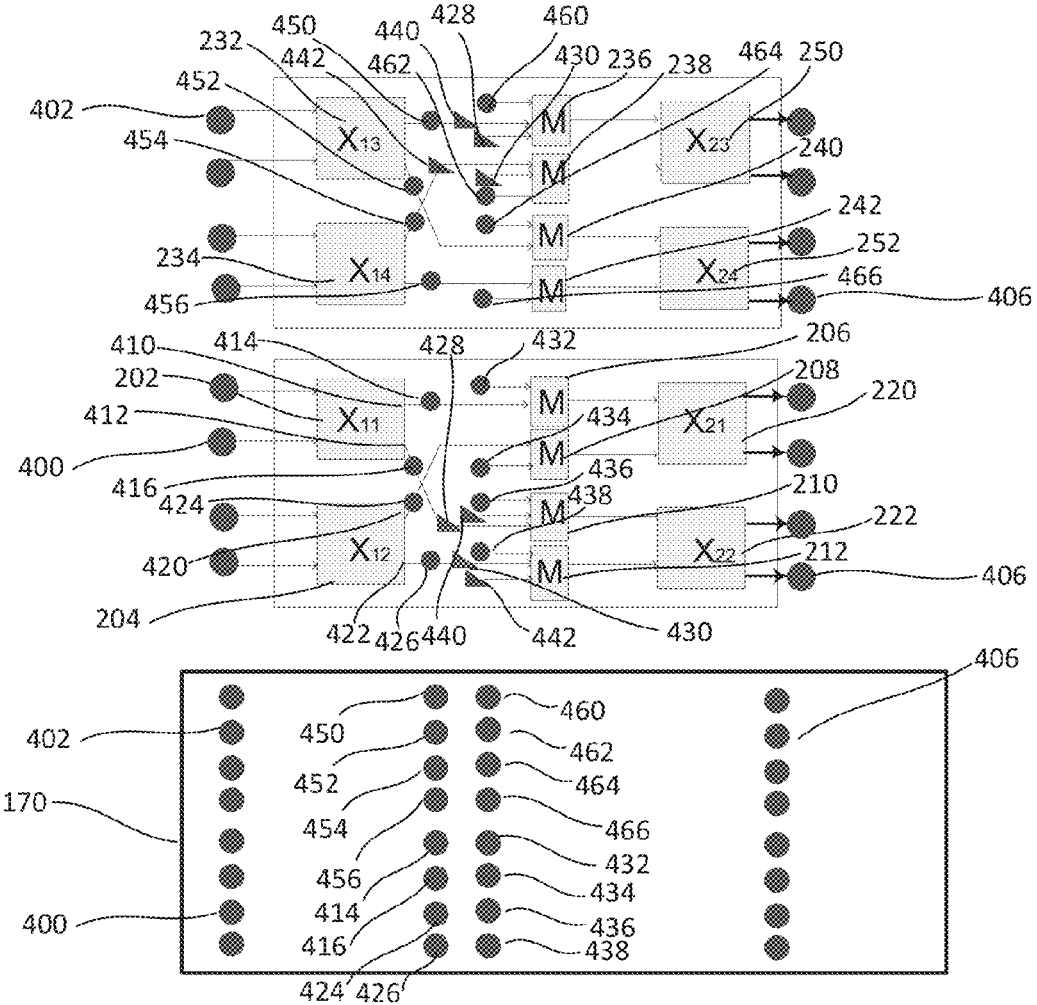
FIG. 4 is a block diagram of example switching dies and the component area of the circuit die in FIG. 1B configured to implement the switching topography in FIG. 3.

FIG. 4 shows the connections between the two switching dies 152 and 154 and the switching interface region 170 in FIG. 1B in order to implement part of the switching network circuit 300 in FIG. 3 in the three dimensional cross point switching unit 150. As explained above, the programmable component area 142 includes the switching interface region 170 having cross connections such as the TSVs 260, 262, 270, 272, and 274 in FIGS. 2A and 2B, which allow routing to and from the stacked switching dies 152 and 154. The switching dies 152 and 154 are configured to implement a cross bar switching circuit such as the configuration of the cross bar circuit 300 in FIG. 3.

As shown in FIG. 4, the switching die 152 includes the two 2×2 cross bar ingress switches 202 and 204, which correspond with the switches 302 (X11) and 304 (X12) in FIG. 3. The switching die 152 also includes the two other middle stage 2×2 switches 220 and 222 corresponding to the switches 312 (X21) and 314 (X22) in FIG. 3. The interconnections at the chip level of the switching die 152 between the ingress switches 202 and 204 and the middle stage switches 220 and 232 are controlled by the multiplexers 206, 208, 210, and 212. The switching die 154 includes the two 2×2 switches 232 and 234, which correspond with the switches 306 (X13) and 308 (X14) in FIG. 3. The switching die 154 also includes the two other middle stage 2×2 switches 250 and 252 corresponding to the switches 316 (X23) and 318 (X24) in FIG. 3. Similarly, the interconnections at the chip level of the switching die 154 between the ingress switches 232 and 234 and the middle stage switches 250 and 252 are controlled by the multiplexers 236, 238, 240 and 242. As will be explained above, the multiplexers 206, 208, 210 and 212 in conjunction with TSVs 260, 262, 270, 272, and 274 in FIG. 2B also allow routing of connections to and from the programmable component area 142 below the switching die 152 and the switching die 154 above the switching die 152. As will be explained below, the multiplexers in conjunction with the TSVs 260, 262, 270, 272, and 274 also allow the routing of connections from the switching interface region 170 on the component die 100 to switching dies above the switching die 154 such as the switching die 156 or the switching die 152 below the switching die 154.

Turning to FIG. 4, a first set of TSVs 400 on the switching interface region 170 provide connections to the four inputs of the ingress switches 202 and 204 on the first switching die 152. A second set of TSVs 402 provide connections to the four inputs of the ingress switches 232 and 234 on the second switching die 154. The switching interface region 170 in this example thus has up to eight ports, which are coupled to the TSVs 400 and 402 to provide inputs to the switching dies 152 and 154. Other TSVs may be used for additional ports if additional switching dies such as the switching die 156 are stacked on the switching die 154. A set of output TSVs 406 are coupled from the outputs of the middle stage switches such as the switches 210 and 212 to output ports on the switching interface region 170. It is to be understood that the outputs from the middle stage switches may be coupled to additional stages of switches on the switching dies 152, 154, 156, and 158 if additional switching flexibility and capability is desired.

The ingress switch 202 on the switching die 152 has two outputs 410 and 412. The first output 410 is coupled to one of the inputs of the multiplexer 236, which may then be routed to the input of the middle stage switch 220 as per the layout of the switching unit 300 in FIG. 3. The first output 410 is also coupled to a TSV 414, which leads to an output port of the switching interface region 170 of the programmable component area 142 on the component die of the programmable logic device 100. As shown in layout of FIG. 3, the second output 412 is coupled to an input of the multiplexer 210, which may then be routed to the input of the middle stage switch 222. The second output 412 of the switch 202 is also coupled to a TSV 416, which leads to an output port of the switching interface region 170 of the programmable component area 142 on the component die. The second output 412 of the switch 202 is also coupled to a TSV 428, which is coupled to an input of the multiplexer 236 of the switching die 154 following the layout of FIG. 3.

Similarly, the ingress switch 204 has two outputs 420 and 422. The first output 420 is coupled to one of the inputs of the multiplexer 208, which may then be routed to the input of the middle stage switch 220 as per the layout of the switching unit 300 in FIG. 3. The first output 420 is also coupled to a TSV 424, which leads to the switching interface region 170 of the programmable component area 142. As shown in the layout of FIG. 3, the second output 422 is coupled to an input of the multiplexer 212, which may then be routed to the input of the middle stage switch 222. The second output 422 is also coupled to a TSV 426, which leads to an output port of the switching interface region 170 of the programmable component area 142. The second output 422 is also coupled to a TSV 430, which is coupled to an input of the multiplexer 238 of the switching die 154 following the layout of FIG. 3.

The multiplexer 206 may select between two separate inputs, which may be connected to one of the inputs of the middle stage switch 220. The first input is the output 410 of the switch 202, which follows the layout of FIG. 3. The second input is a TSV 432 from the switching interface region 170 of the programmable component area 142, which allows bypassing the switch 202 and direct access to the inputs of the middle stage switch 220. Similarly, the multiplexer 208 may select between two separate inputs, which may be connected to the middle stage switch 222. The first input is the output 422 from the switch 204, which follows the layout in FIG. 3. The second input is a TSV 434 from the switching interface region 170 of the programmable component area 142, which allows bypassing the switch 202 and directly accessing the inputs of the middle stage switch 220. Similarly, two TSVs 436 and 438 from the switching interface region 170 of the programmable component area 142 are connected to the multiplexers 210 and 212, respectively, to bypass the switch 204 and directly access the inputs of the middle stage switch 222.

The multiplexer 210 may select between three inputs. The first input is the second output 412 of the switch 202. The second input is the TSV 436 from the switching interface region 170 of the programmable component area 142 to bypass the switch 204 and directly access the inputs of the middle stage switch 222. The third input of the multiplexer 210 is the first output of the switch 232 on the switching die 154, which is routed via a TSV 440 and follows the configuration of FIG. 3. Similarly, the multiplexer 212 may select between three inputs. The first input is the second output 422 of the switch 204. The second input is the TSV 438 from the programmable component area 142 to bypass the switch 204 and directly access the inputs of the middle stage switch 222. The third input of the multiplexer 212 is the output of the switch 234 of the switching die 154, which is routed by a TSV 442 and follows the configuration of FIG. 3.

The switching die 154 is stacked on the switching die 152. The inputs of the switches 232 and 234 are coupled to the switching interface region 170 of the programmable component area 142 via TSVs 402. The outputs of the switches 232 and 234 are coupled to TSVs 450, 452, 454, and 456 to provide the outputs to the switching interface region 170 of the programmable component area 142. Two TSVs 460 and 462 from the switching interface region 170 of the programmable component area 142 are connected to the multiplexers 236 and 238, respectively, to bypass the switch 232 and directly access the inputs of the switch 250. Two TSVs 464 and 466 from the switching interface region 170 of the programmable component area 142 are connected to the multiplexers 240 and 242, respectively, to bypass the switch 234 and directly access the inputs of the switch 252.

Similar to the switches 202 and 204 of the switching die 152, the outputs of the switches 232 and 234 are connected to inputs of the multiplexers 236, 238, 240, and 242 to allow routing to the inputs of the switches 250 and 252 respectively. The multiplexer 236 includes three inputs, which may be selected, one of which is coupled to the output of the switch 232. The second input is an input routed from the TSV 460 from the switching interface region 170 of the programmable component area 142. The third input is the output of the switch 204 of the switching die 152 from the TSV 428 following the layout in FIG. 3. Similarly, the multiplexer 238 has three inputs, which may be selected. The first input is coupled to the output of the switch 234. The second input is routed from the TSV 462 from switching interface region 170 of the programmable component area 142. The third input is the output 422 of the switch 204 of the switching die 152 that is routed via the TSV 430, following the configuration in FIG. 3.

The multiplexer 240 has two inputs, which may be selected. The first input is one of the outputs of the switch 232 following the configuration of FIG. 3. The second input is an input from the switching interface region 170, which is routed via the TSV 464. Similarly, the multiplexer 242 also has two inputs, which may be selected. The first input is one of the outputs of the switch 234 following the configuration in FIG. 3. The second input is an input from the switching interface region 170, which is routed via the TSV 466.

As may be seen in FIG. 4, the cross point switch layout in FIG. 3 is split in implementation between the programmable component die including the switching interface region 170 and the hardened logic switching dies 152, 154, 156, and 158. The stacked switching dies such as the switching dies 152, 154, 156, and 158 allow the implementation of a cross connect switch, which is scalable by adding additional switching dies and corresponding cross connects between the switching dies and the switching interface region 170 of the programmable component area 142. Thus, the network of switches may be accomplished by duplicating the existing switching die structure and adding additional switching dies on the top of the existing switching dies. In this example, the switching die 152, in combination with the switching interface region 170, allows a 4×4 cross point switch, which may be configured using the control circuit 180 controlling the outputs of the multiplexers 206, 208, 210, and 212. Such a cross point switch may be essentially hardwired by maintaining the control signals to the multiplexers 206, 208, 210, and 212 to the desired routing between the switches 202, 204, 220, and 222 and the switching interface region 170. The resulting cross-point switch may also be configurable by changing the control signals to multiplexers 206, 208, 210, and 212 to allow combination of inputs from the switching interface region 170.

Expanding this network to twice the port count may be accomplished by duplicating the existing network, and adding a new column to the left and the right in FIG. 3. In this example, the second switching die 154 may be added on top of the first switching die 152. On the left column, the top entry (switches 202 and 204) is connected to the top port of the top matrix (switch 220) and the top port of the bottom matrix (switch 250). This pattern continues (one top, one bottom connection) for the ingress and egress switches in FIG. 3. The added column to the right to the output switches is a mirror of the interconnect pattern of the middle stage switches in FIG. 3.

The desired cross-point switch may be scaled by adding 4 more inputs in the form of the second switching die 154. The result is an 8×8 cross point switch, which may be configured using the control circuit 180 controlling the outputs of the multiplexers 206, 208, 210, and 212 on the first switching die 152 and the multiplexers 236, 238, 240, and 242 on the second switching die 154. The cross-point switch may either be hardwired where the control signals are maintained to the multiplexers or may be configurable by changing the control signals depending on the desired connections between switches. This process allows port scaling to be done in the three dimensional stacked die environment of the cross-point switching unit 150 by building a fixed-size cross point switch with the switching dies 152 and 154 but adding die to die interconnection and on chip muxing for both dies as shown in FIG. 2A-2B.

This structure also allows for width scaling (scaling a crossbar to a wider bit width for each input port). Width scaling in this example may be accomplished by connecting a different bit range to each of the respective switches of the switching dies from the switching interface region 170. For example, a double width input port could be accomplished by assigning one input of the first switch 202 to bits 0-7 of the port and one input of the switch 204 to bits 8-15 of the port. The second input port would be a combination of the other input of the switch 202 (bits 0-7) and the other input of the switch 204 (bits 8-15). Thus, fewer input ports would be available, but the existing ports would be combined to divide the data and therefore result in a wider data path.

The entire cross point switch would not need to be implemented on hard logic on the switching dies 152, 154, 156, and 158. The first stage or last stages of switching could be implemented in soft logic that also has access to the TSV interconnect structure to use other hard switching dies. Thus the ingress switches on the switching dies 152 and 154 in FIG. 4 could be implemented via programmable hardware instead of in hard logic.

Alternatively, the switching die implementing a switch may be constructed to be late-binding programmable. In this way, the switch can be programmed to implement a blocking network at significantly lower cost than a Benes-network as previously described. This would include the incorporation of a configuration processor or logic such as the configuration processor 160 in FIG. 1, which solves a static configuration and generates the required control lines for implementing the desired switch configuration from the switching unit 150 via control of the multiplexers on the switching dies 152, 154, 156, or 158. Another process may be the transportation of a switch program via a TSV to the multiplexers on the switching dies from an FPGA circuit such as one of the programmable regions 140 in FIG. 1 configured to execute a switch configuration program.

The hard wired switching dies implementing the three dimensional crossbar switching unit 150 serve purposes that are separable from the core functionality of a programmable circuit or a fixed function processing circuit. These include the physical coding sublayer (PCS) and crossbar function for lane re-ordering and striping.

For example, the configuration in FIG. 3, is a specific implementation of n=m=r=4 implementing an 8×8 crossbar re-arrangeable permutation network. The specific implementation in FIG. 3 may be used for a soft-Ethernet core for PCS virtual lane re-ordering. The programming of the switches on the switching dies 152 and 154 via the multiplexers is pseudo-static and determined at boot-time by a simple processor such as the processor 160, which allows for the appropriate programming of the switches.

Figure 5:
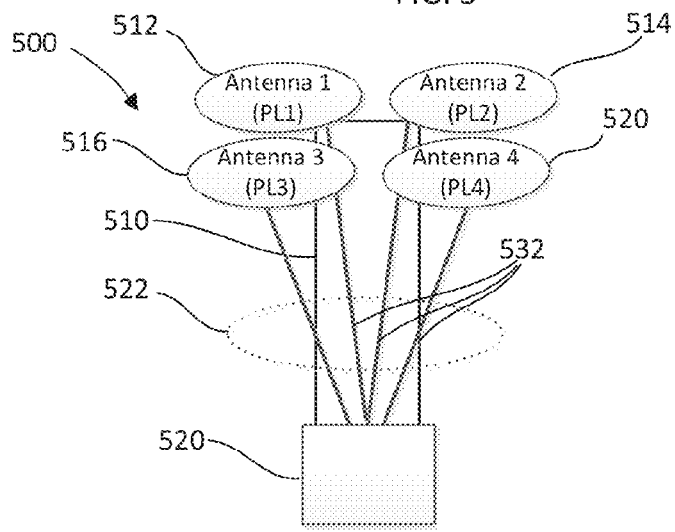
FIG. 5 is a diagram of a wireless communications system.

Another example of an application incorporating the example three-dimensional cross point switching unit is a wireless communication system. FIG. 5 is a diagram of a wireless communications system 500 using the example cross point switching unit. The wireless communication system 500 has a series of cell phone towers such as a cell phone tower 510. The cell phone tower 510 includes multiple antennas 512, 514, 516, and 518. Each of the antennas 512, 514, 516, and 518 must be separately powered up and powered down. In the operation of the wireless communication system 500, the antennas 512, 514, 516, and 518 are selectively powered up to receive and transmit network traffic. Each powered antenna adds additional capability to handle a corresponding increase in network traffic volume. For example, during peak times, such as during the day in a business district, all of the antennas 512, 514, 516, and 518 are powered up to meet the requirements of peak network traffic. In non-peak times, such as late at night, only one of the antennas such as the antenna 512 is powered up as the network traffic is at a lower volume.

Figure 6:
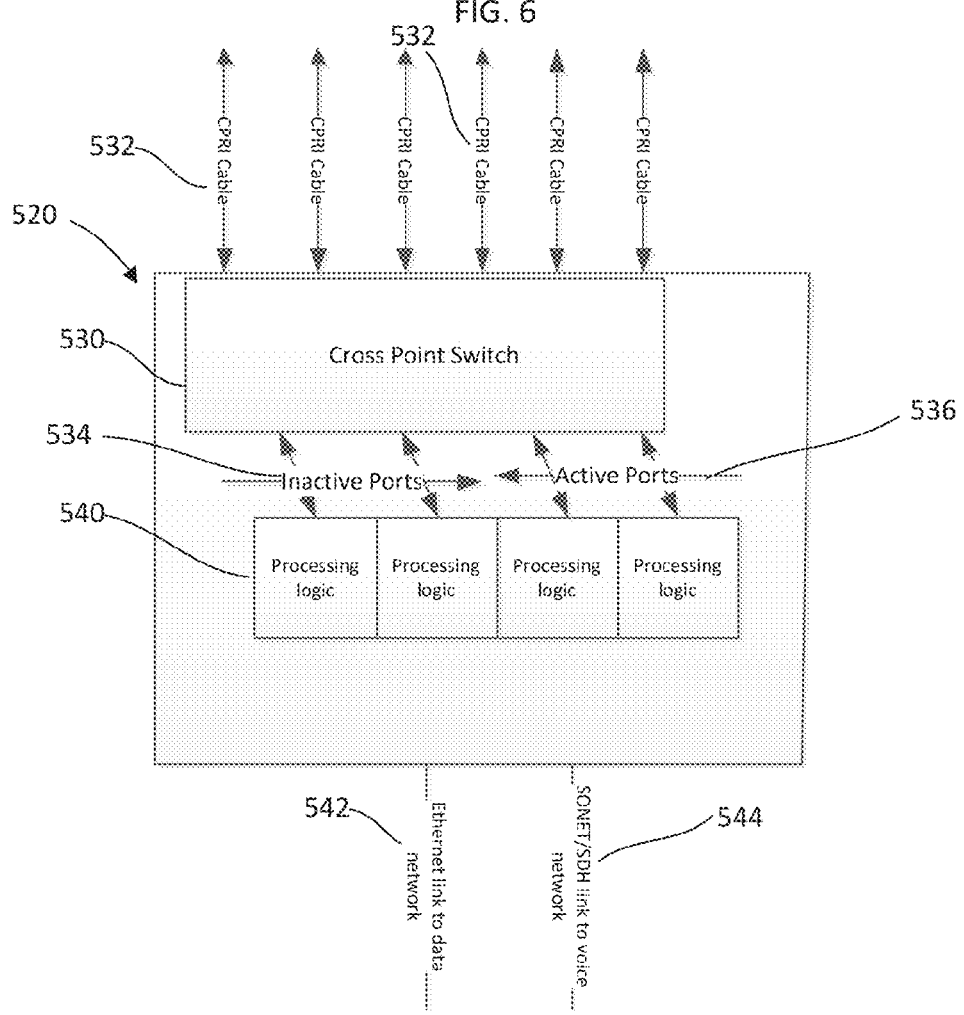
FIG. 6 is a block diagram of a programmable hardware circuit component in the wireless communications system in FIG. 5 using an example cross point switching unit.

The system 500 includes a baseband processing unit 520, which is coupled to the antennas 512, 514, 516, and 518 via an interface 522, which includes a series of cables 532. In this example, the antennas 512, 514, 516, and 518 communicate with the baseband processing unit 520 via a CPRI communications standard operated by the interface 522. The baseband processing unit 520 includes a programmable circuit such as the programmable logic device 100 in FIG. 1A. As shown in FIG. 6, the baseband processing unit 520 includes a scalable cross point switching unit 530, which is similar to the cross point switching unit 150 in FIGS. 1-4. The inputs of the cross point switching unit 150 are the series of cables 532 of the interface 522, which each carry CPRI signals from one of the antennas 512, 514, 516, and 518. The signals are routed through the cross point switching unit 150 to different output ports 534 and 536. The output ports 534 and 536 are coupled to processing logic units 540. Each of the processing logic units 540 process the signals and output corresponding media through output ports. In this example, the baseband processing unit 520 includes a data port 542 for data signals and a SONET port 544 for voice data. The output ports 542 and 544 are coupled to different networks such as a data network and a phone network, respectively.

As explained above, the wireless carrier operating the system 500 may have activation patterns for the antennas 512, 514, 516, and 518 depending on time of day correlating with network traffic volume. For example, from 6:00 a.m. to 8:00 p.m. all four antennas 512, 514, 516, and 518 are activated, from 8:00 p.m. to 11:00 p.m. antennas 512 and 518 are active and from 11:00 p.m. to 5:00 a.m. only the antenna 514 is active. These changes to antenna activations may be very complex, especially as the number of ports and antennas increases. A well-used design technique puts all the used ports together and the unused ports together to make processing simpler as only the grouped ports that are in use need be processed.

As shown in FIG. 6, the three-dimensional cross point switching unit 530 allows the various processing blocks of the processing logic 540 to be effectively turned off by switching the outputs of active antennas to selected processing blocks. Using the cross point switching unit 530 eliminates the various cases of port activity. As explained above, certain output ports are inactive such as the ports 534 when some of the antennas are not powered. The active ports such as the ports 536 are coupled via the cross point switching unit 530 to the active antennas. Rather than needing to verify that a first processing logic block and a second processing logic block or antenna 512 (PL1) and antenna 516 (PL3) or antenna 512 (PL1) and antenna 518 (PL4) all need to work together correctly, the cross point switch 530 allows the system designer to only need to verify that antenna 512 or antenna 512 and antenna 514 or antennas 512, 514 and 516 or antennas 512, 514, 516 and 518 all work together correctly. Since the processing logic is complex, the simplification that the cross point switching unit 530 allows is considerable and allows faster time to market for suppliers who use this structure.

Another example of an application using the switching unit 150 may be a configurable vlane-reordering switch that matches the Ethernet PCS vlane-reordering requirements as well as striping for Interlaken (ILKN), separation of RX and TX, etc. As understood by one of skill in the art, Interlaken is an interface that is a channelized interface that can be mapped to a mix of different port speeds. This interface is frequently used in data communications carrier equipment to have channels communicate with a packet processing block. In practice, Interlaken allows different customers to purchase different ports for scaling desired bandwidth. For example, an Interlaken interconnect may be implemented by configuring the switching unit 150 to provide bundles of serial links to create a logical connection between components with multiple channels, backpressure capability, and data-integrity protection as per the Interlaken protocol.

Figure 7:
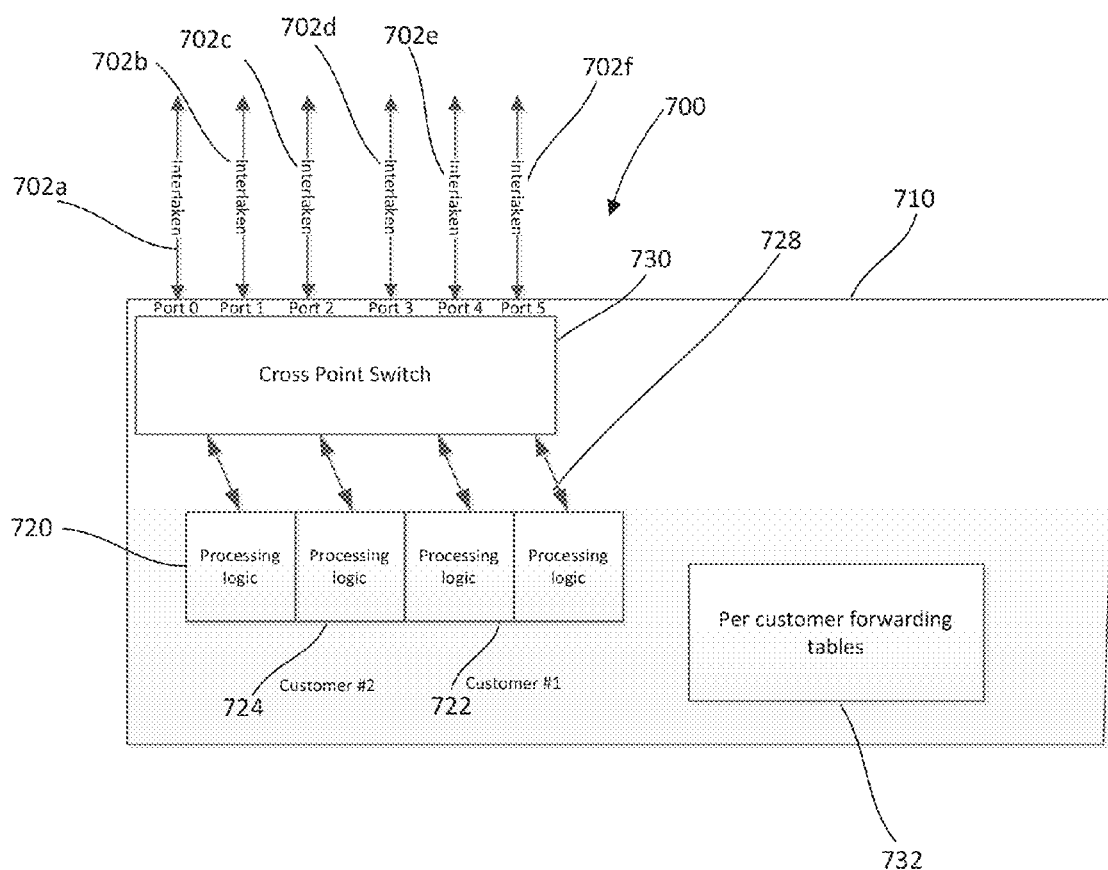
FIG. 7 is a block diagram of a programmable hardware circuit component using an example cross point switching unit in an Interlaken application.

FIG. 7 is a block diagram of a processing system 700 used for Interlaken interconnection for routing data signals to different outputs. The processing system 700 includes a series of Interlaken input ports 702a, 702b, 702c, 702d, 702e, and 702f (ports 1-6) in this example. The processing system 700 includes a band processing unit 710 that may be a programmable circuit such as the programmable logic device 100 in FIG. 1A. The processing unit 710 includes different processing logic blocks 720, which may be used to process bandwidth traffic from the ports 702a-e to different customers. In this example, the processing logic blocks include a processing block 722, which is allocated to a first customer and a processing block 724 allocated to a second customer. Each of the processing blocks 720 are coupled to outputs 728 from a three-dimensional cross point switching unit 730. The allocation of the Interlaken ports 702a-e to the processing logic is determined by a customer forwarding table 732. The Interlaken input ports 702a-e are coupled to the scalable cross point switching unit 730, which is similar to the cross point switching unit 150 in FIGS. 1-4. The Interlaken input ports 702a-f are routed via the cross point switching unit 730 to the processing logic blocks 720, which are associated with different customers.

For example, assuming a carrier has customer 1 and 2 both purchasing two input ports of bandwidth. The carrier may assign customer 1 to ports 1 and 2 (702a and 702b), and customer 2 to ports 3 and 4 (702c and 702d) to keep customer processing efficient. If customer 1 wants to purchase additional port bandwidth, additional input ports may be assigned to the processing block associated with customer 1. For example, customer 1 may be assigned port 5 (702e), which allows customer 1 to receive network traffic from ports 1, 2, and 5. This is done so that customer 2 is not affected by customer 1 purchasing additional service. In order to process the traffic correctly, the carrier must move port 5 next to ports 1 and 2 so they can all use the same database for deciding where packets need to go. However, switching the ports as in current practice, such as moving port 3 to customer 1 and moving port 5 to customer 2 causes service interruptions.

The switching unit 730 allows the ports to be moved virtually to the associated customer thus avoiding service interruptions. Thus, the port 702 e (port 5) is simply routed by the cross point switching unit 730 to the processing logic 726 associated with customer 1 without interrupting the data flow of the ports assigned to customer 2. This change may be accomplished by changing the customer forwarding table 732 without interrupting service to customer 2.

The ability to change the configuration of both the number of input ports as well as the width of the ports allows greater versatility of adapting a programmable circuit device to different user needs. Scaling the width of the cross point switch allows the bit width of the cross point switch to be varied. Switching requirements may be both dynamic (programmable on a per-cycle basis to change the permutation function) and static (programmable as a setup and tear-down). A dynamic switch would be used for switch-fabric or other re-ordering functions while a static switch would apply to applications such as an OTN muxponder or VLANE reordering problems where the permutation function changes only when a client interface is introduced.

While the present principles have been described with reference to one or more particular examples, those skilled in the art will recognize that many changes can be made thereto without departing from the spirit and scope of the disclosure. Each of these examples and obvious variations thereof is contemplated as falling within the spirit and scope of the disclosure, which is set forth in the following claims.

What is claimed is:

1. A configurable cross point switching system comprising:
   a component die including logic components and a switching interface region to allow connection of the logic components;
   a first switching die located on the component die, the first switching die including an ingress stage switch having an input and an output and a middle stage switch having an input;
   a multiplexer having an input coupled to the output of the ingress stage switch and an output coupled to the input of the middle stage switch;
   an input through-silicon via (TSV) coupled between an input port in the switching interface region and the input of the ingress stage switch; and
   a second input TSV coupled between a second input port in the switching interface region of the component die and another input of the multiplexer.

2. The switching system of claim 1, wherein the switching system is configured to select a connection to the middle stage switch from the inputs of the multiplexer.

3. The switching system of claim 1, wherein the multiplexer is located on the first switching die.

4. The switching system of claim 3 further comprising:
   a second switching die stacked on top of the first switching die, the second switching die including an ingress stage switch with an input and an output coupled to an input of a multiplexer and a middle stage switch coupled to the output of the multiplexer; and
   an input TSV coupled between a port in the interconnection interface region and the input of the ingress stage switch;
   a first switching die input TSV coupled between the output of the ingress stage switch of the first switching die and another input of the multiplexer of the second switching die, wherein the switching system is configured to select a connection to the middle stage switch of the second switching die via the inputs of the multiplexer of the second switching die; and
   a second switching die input TSV coupled between the output of the ingress stage switch of the second switching die and another input of the multiplexer of the first switching die.

5. The switching system of claim 4, wherein the multiplexers of the first and second switching dies are configured to select a predetermined number of input ports on the switching interface region as switch inputs and a predetermined number of output ports on the switching interface regions as switch outputs.

6. The switching system of claim 5, wherein the switching system is configured via the multiplexers of the first and second switching dies to create a wide channel bit length port by assigning the multiple inputs of the egress switches of the first and second switching dies to a single input port.

7. The switching system of claim 1, wherein the ingress stage switch, the middle stage switch and the multiplexer are fixed circuitry.

8. The switching system of claim 1, wherein the interconnection interface region includes programmable logic to select between the first and second input ports.

9. The switching system of claim 8, wherein the configuration of the interconnection interface region is generated on FPGA logic of the component die, the configuration information transmitted via interconnections to the multiplexer.

10. The switching system of claim 1, further comprising a processor to program the connections to the input of the middle switch via the multiplexer.

11. The switching system of claim 1, further comprising:
a first output TSV coupling the output of the ingress stage switch to a first output port in the interconnection interface region; and
a second output TSV coupling the output of the middle stage switch to a second output port in the interconnection interface region.

12. The switching system of claim 1, wherein the switching system is configured via the multiplexers of the first and second switching dies to conform to the Ethernet physical coding sublayer protocol.

13. The switching system of claim 1, wherein the switching system is configured via the multiplexers of the first and second switching dies to accommodate inputs according to the Interlaken interface protocol.

14. A method of configuring a cross point switch for cross connections of components on a component die, the method comprising:
adding a first switching die over the component die, the first switching die including a plurality of ingress stage switches cross connected to multiplexers having outputs coupled to the inputs of a plurality of middle stage switches;
coupling an input port to the inputs of the ingress switches of the first switching die; and
controlling the multiplexers to select the inputs from the input port or the outputs of the ingress stage switch for the middle stage switch.

15. The method of claim 14, further comprising expanding the input ports of the cross point switch by:
adding a second switching die over the first switching die, the first switching die including a plurality of ingress stage switches cross connected to multiplexers having outputs coupled to the inputs of a plurality of middle stage switches;
coupling an input port to the inputs of the ingress switches of the second switching die;
cross coupling some of the outputs of the ingress switches of the first switching die to the multiplexers of the second switching die; and
cross coupling some of the outputs of the ingress switches of the second switching die to the multiplexers of the first switching die.

16. A configurable cross point switching unit comprising:
a component die including an interconnection interface region including input ports and output ports;
a plurality of switching dies stacked on the component die, each of the plurality of switching dies including a plurality of ingress switches, a plurality of multiplexers and a plurality of middle stage switches, wherein the outputs of the ingress switches are connected via the multiplexers to the inputs of the middle stage switches for each of the plurality of switching dies;
a plurality of input through-silicon vias (TSVs) between the input ports of the interconnection interface region and the inputs of the ingress switches of the plurality of switching dies;
a plurality of output TSVs between the output ports of the interconnection interfaces and the outputs of the ingress switches and the middle stage switches; and
wherein at least one of the switching dies includes a first plurality of TSVs between the outputs of the ingress switches and the multiplexer of a switching die on top of the at least one of the switching dies and a second plurality of TSVs between the outputs of the ingress switches and the multiplexer of a switching die below the at least one of the switching dies.

17. The configurable cross point switching unit of claim 16, wherein the inputs to the multiplexers are programmed by configuration information generated by FPGA logic of the component die, the configuration information transmitted via interconnections to the multiplexer.

18. The configurable cross point switching unit of claim 16, further comprising a processor to program the connections to the input of the middle switch via the multiplexer.

19. The configurable cross point switching unit of claim 16, wherein the multiplexers of the first and second switching dies are configured to select a predetermined number of input ports on the switching interface region as switch inputs and a predetermined number of output ports on the switching interface regions as switch outputs.

20. The configurable cross point switching unit of claim 16, wherein the multiplexers of the first and second switching dies are configured to create a wide channel bit length port by assigning the multiple inputs of the egress switches of the first and second switching dies to a single input port.

* * * * *